(12) United States Patent
Carinci et al.

(10) Patent No.: US 10,520,571 B2
(45) Date of Patent: Dec. 31, 2019

(54) MAGNETIC RESONANCE APPARATUS AND MULTI-SLICE DATA ACQUISITION METHOD WITH PREPARATION PULSES FOR SLICES BEING SET DEPENDENT ON THE SLICE POSITION WITHIN A TARGET VOLUME

(71) Applicant: Siemens Healthcare GmbH, Erlangen (DE)

(72) Inventors: Flavio Carinci, Erlangen (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 231 days.

(21) Appl. No.: 15/454,146

(22) Filed: Mar. 9, 2017

(65) Prior Publication Data
US 2017/0261586 A1 Sep. 14, 2017

(30) Foreign Application Priority Data

Mar. 9, 2016 (DE) .................... 10 2016 203 834

(51) Int. Cl.
*G01R 33/56* (2006.01)
*G01R 33/36* (2006.01)
*G01R 33/483* (2006.01)

(52) U.S. Cl.
CPC ..... *G01R 33/5607* (2013.01); *G01R 33/3628* (2013.01); *G01R 33/4835* (2013.01)

(58) Field of Classification Search
CPC ........... G01R 33/5607; G01R 33/4835; G01R 33/3628
See application file for complete search history.

(56) References Cited

U.S. PATENT DOCUMENTS

| 5,729,138 A | 3/1998 | Purdy et al. |
| 6,091,242 A * | 7/2000 | Hanawa ............. G01R 33/4833 324/300 |
| 2017/0234953 A1 | 8/2017 | Carinci et al. |

* cited by examiner

*Primary Examiner* — G. M. A Hyder
(74) *Attorney, Agent, or Firm* — Schiff Hardin LLP

(57) ABSTRACT

In a method and apparatus for acquiring magnetic resonance data from a slice package composed of multiple measured slices as a target volume by executing a measuring sequence, prior to each scan of one of the measured slices, the measuring sequence includes a preparation pulse associated with the measured slice for signal suppression of a type of saturation molecule. This said preparation pulse acts on the entire target volume, and a pulse parameter of the preparation pulse is chosen for a measured slice group, composed of at least one measured slice, as a function of resonance information on the contiguous partial volume covered by the measured slice group. The pulse frequency and/or the pulse bandwidth are chosen as pulse parameters as a function of resonance information describing at least the resonance frequencies of the type of saturation molecule and a type of target molecule, the magnetic resonance data of which is to be acquired, in the contiguous partial volume of the target volume that covers the measured slice group.

17 Claims, 5 Drawing Sheets

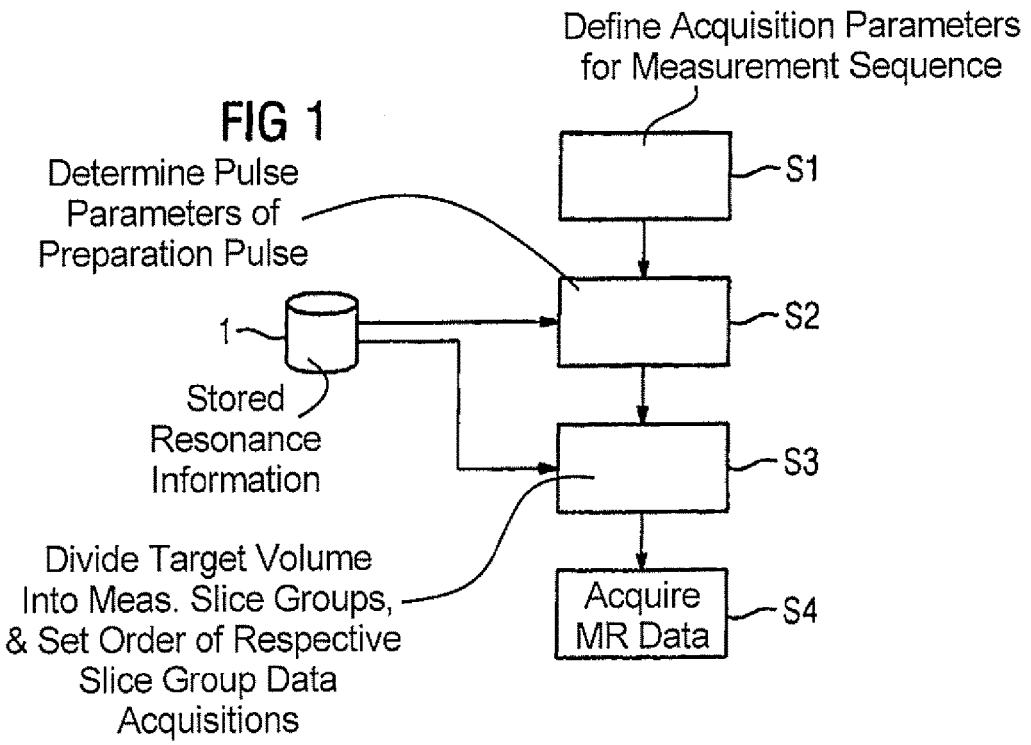
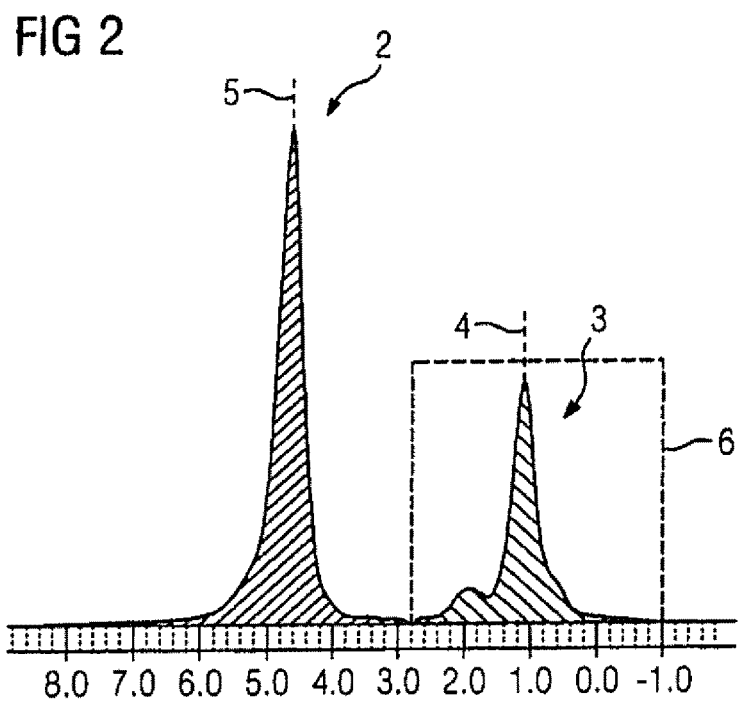

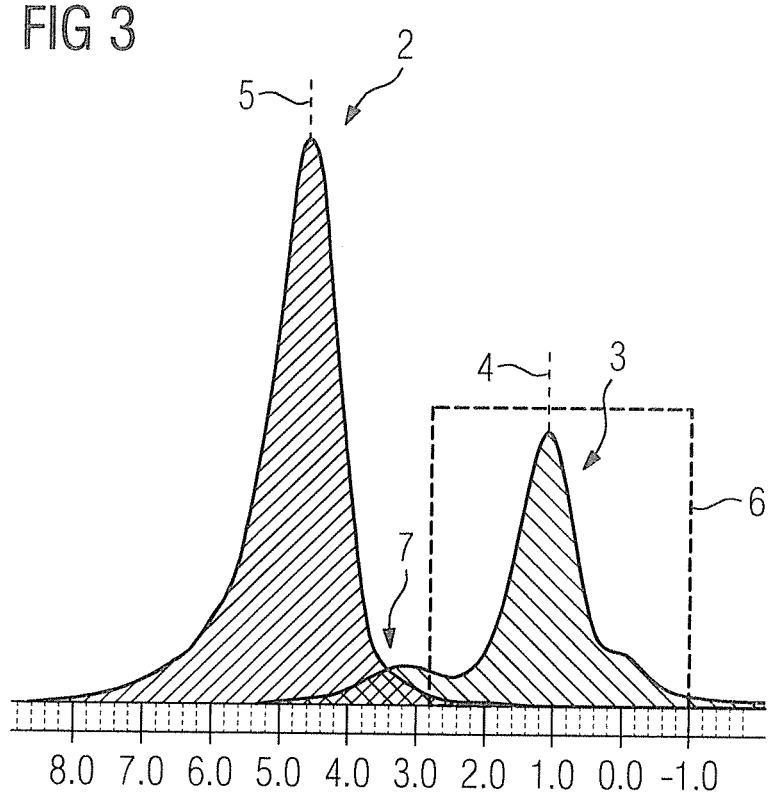

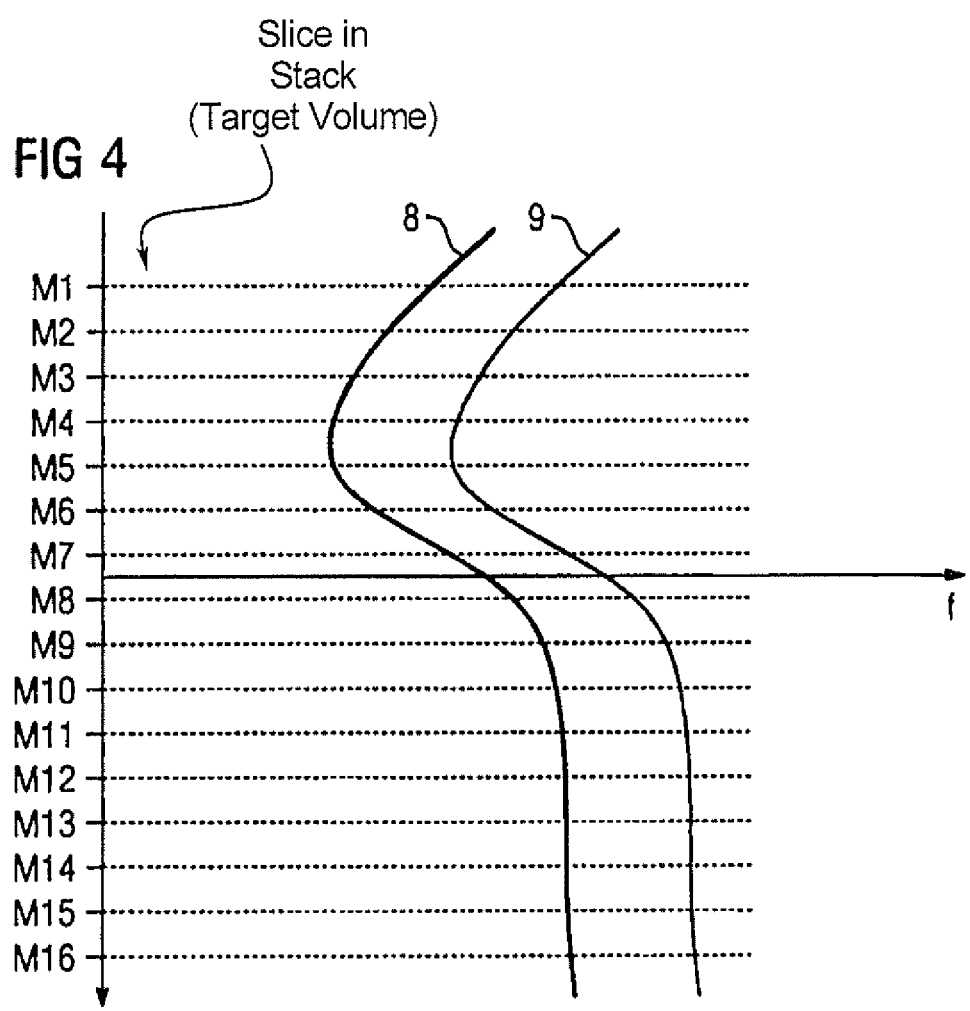

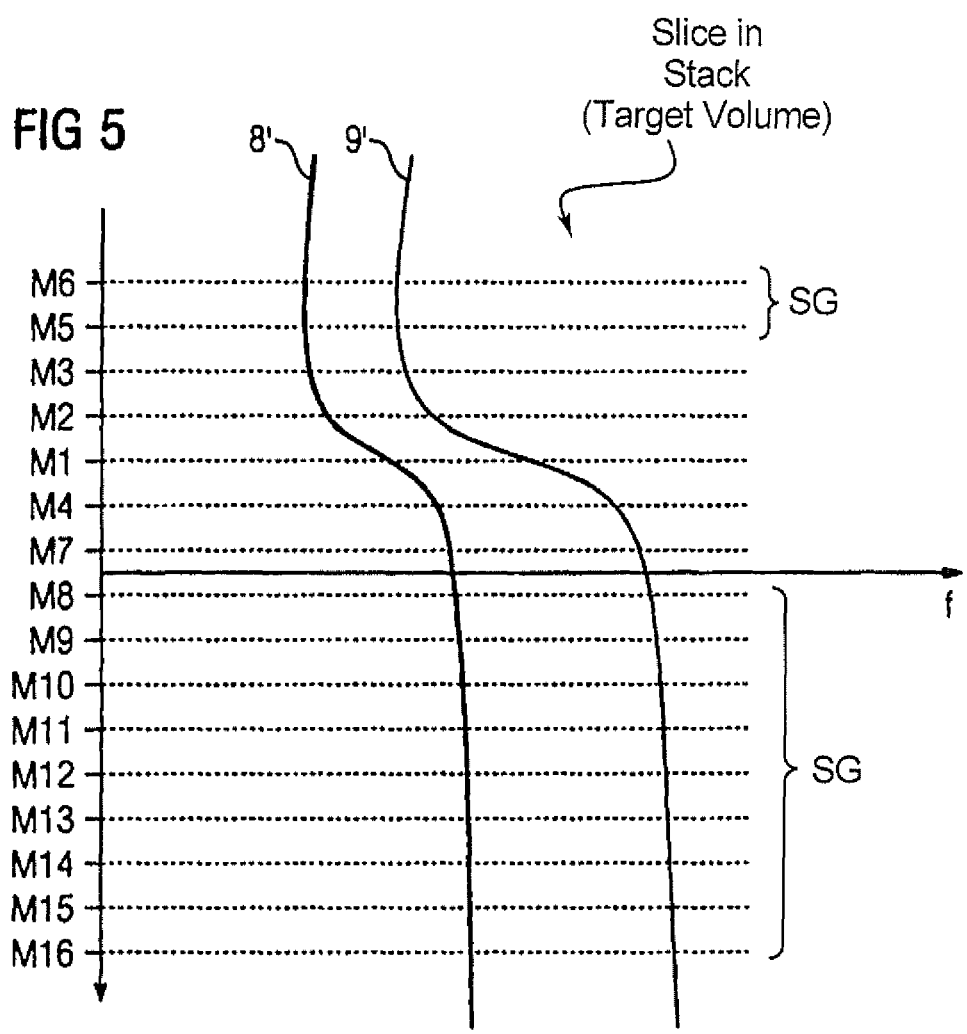

MAGNETIC RESONANCE APPARATUS AND MULTI-SLICE DATA ACQUISITION METHOD WITH PREPARATION PULSES FOR SLICES BEING SET DEPENDENT ON THE SLICE POSITION WITHIN A TARGET VOLUME

BACKGROUND OF THE INVENTION

Field of the Invention

The invention concerns a method for acquiring magnetic resonance data of a slice package composed of multiple measured slices as a target volume with a magnetic resonance scanner using a measuring sequence, wherein the measuring sequence includes, prior to each scan of one of the measured slices, a preparation pulse associated with the measured slice for signal suppression of one type of saturated molecule, said preparation pulse acting on the entire target volume, wherein a pulse parameter of the preparation pulse is chosen for a measured slice group, composed of at least one measured slice, as a function of resonance information of the contiguous partial volume covered by the measured slice group. In addition, the invention concerns a magnetic resonance apparatus and an electronically readable data carrier for implementing such a method.

Description of the Prior Art

Saturation techniques, in particular fat saturation techniques, are extensively known in magnetic resonance imaging and are frequently employed in clinical imaging. Such fat saturation techniques mostly exploit the fact that the resonance frequencies of fat and water are slightly different, this being known as chemical shift. However, such chemical shifts also exist with respect to other types of molecules, such that saturation techniques that are intended to separate types of molecule other than fat and water from one another can also be used in imaging, for example to suppress silicone. In this case a preparation pulse, which can also be called a saturation pulse, is emitted, and excites only the spin of the type of molecule whose signal is to be suppressed, such that the magnetization thereof is saturated and not affected by other, specific excitation pulses, which then act on the other type of molecule, in other words the type of target molecule from which the magnetic resonance signals are to be received (acquired), Such a measurement sequence is shown in FIG. 7.

Fat saturation techniques or other saturation techniques respond extremely sensitively to inhomogeneous spatial distributions of the static magnetic field, in other words of the main magnetic field (B0). In the regions in which these field inhomogeneities occur, two undesired effects can be observed, namely incomplete fat saturation and unwanted water saturation. The reason for this is mainly that the fat saturation requires frequency-selective preparation pulses that act on the entire volume of the examination object, at least the entire target volume to be acquired in the form of multiple slices, where strong field inhomogeneities can occur, particularly at higher magnetic field strengths. The strength and the spatial distribution of such field inhomogeneities depend on the anatomical region. For example, particularly strong inhomogeneities occur in the thorax, since air is present there in the lungs, which has a very different magnetic susceptibility compared to biological tissue.

The effect of the fat saturation pulse or general preparation pulse is based on the specific choice of its pulse parameters, in particular the pulse frequency and the pulse bandwidth. Magnetic field inhomogeneities mean that the fat and water peaks in the frequency spectrum, if whole partial volumes such as measured slices are considered, are widened, such that the frequency range between the two peaks becomes a critical region that may contain elements of both types of molecules. The result here can be limited to fat saturation or unwanted water saturation.

If preparation pulses are used to suppress signals of a type of saturation molecule, for example from fat, their pulse frequency or nominal frequency usually differs precisely by the chemical shift to the type of target molecule from the subsequent excitation pulse which is to excite the non-saturated spin of the type of target molecule, in order to measure the decay of the excitation, as known, as magnetic resonance signals and to acquire corresponding magnetic resonance data. If only extremely narrow regions are acquired, the problem of field inhomogeneities can be suppressed, by using different frequency shifts and pulse frequencies for the preparation pulse and the excitation pulse as a function of the partial volume acquired, in particular specifically as a function of the anatomical region. Many imaging techniques, however, are aimed at the acquisition of larger target volumes within the human body, which then are usually acquired as slice packages of a number of measured slices captured one after the other. The larger the acquired target volume, the larger also are the spatial variations in the basic magnetic field, so that severe problems can occur.

In the subsequently published German patent application DE 10 2016 202 400.0 it was proposed in this respect, in order to achieve improved chemical selectivity in the saturation of the magnetization of particular types of molecule, to adjust the coil currents of shim coils, which are used to reduce a local inhomogeneity in the basic magnetic field, and/or at least one pulse parameter of the preparation pulse as a function of the position in the target volume of the measured slice currently to be acquired. It is consequently possible, when emitting the preparation pulse, to take into consideration the position of the target volume at which the measured slice, for which magnetization data is to be captured immediately after the transmission of the preparation pulse, is located. Because of the known position of the measured slice, the chemical selectivity of the preparation pulse can be optimized locally for the respective measured slice to be examined or for a partial volume of the measured volume which includes said measured slice. The at least one pulse parameter can be a pulse frequency and/or a spectral composition and/or a pulse amplitude of the preparation pulse and/or a relative transmit amplitude for different antennas via which the preparation pulse is emitted.

The pulse frequency describes the frequency at which the spectral distribution of the preparation pulse is at its maximum, which also applies for the following description regardless of the subsequent printed publication. By adjusting the spectral composition and/or the pulse frequency it is possible in particular to balance mistunings of the resonance frequency of the type of molecule to be excited based on inhomogeneities in the main magnetic field. However, this means that the pulse parameters are adjusted in accordance with DE 10 2016 202 400.0 if need be as a function of an absolute B0 field map in relation to the type of target molecule. An improvement can in fact be achieved in this way, further potential nevertheless existing for an improvement in the saturation behavior and thus the quality of the magnetic resonance data to be acquired.

SUMMARY OF THE INVENTION

An object of the invention is hence to provide an opportunity for the further improvement of the performance of saturation techniques, in particular fat saturation techniques, in multislice imaging.

To achieve this object, in a method of the type above, the pulse frequency and/or the pulse bandwidth is chosen, in accordance with the invention, as pulse parameters as a function of resonance information describing at least the resonance frequencies of the type of saturation molecule and of a type of target molecule, from which the magnetic resonance data are to be acquired, in the contiguous partial volume of the target volume that covers the measured slice group.

The invention is based on the insight that, in order to optimize the saturation behavior, it is not sufficient in all cases merely to consider the field inhomogeneities or the effects thereof on the type of target molecule, but also to have basic information in the relative relationships between the type of saturation molecule and the type of target molecule, consequently the relative position of the resonance frequency spectra. Thus, for example, cases are known in which the chemical shift can change as a function of an anatomical region considered or a contiguous partial volume considered of the target volume, consequently for example the resonance frequencies of water and fat can converge. Furthermore with the partial volume a larger region in the target volume is considered, in which clearly different relationships can also occur, such that an overlap between the resonance frequency spectra of the type of target molecule and the type of saturation molecule can occur in a critical frequency range, which in the inventive embodiment can likewise expediently be taken into consideration. Preferably therefore the resonance information can in each case comprise a resonance frequency spectrum of the type of saturation molecule and the type of target molecule and/or a description of such resonance frequency spectra, in particular a peak frequency and a peak width. Thus an orientation of the specific dimensioning of the preparation pulse, in particular of the spectral composition thereof, can take place for example at the peak frequencies of the type of saturation molecule and at the chemical shift, wherein of course it is also possible for other pulse parameters of the preparation pulse to be adjusted specifically for a measured slice group, for example a pulse amplitude and/or a relative transmit amplitude for different antennas via which the preparation pulse is emitted, and/or a pulse parameter generally determining the spectral distribution of the preparation pulse. In this case the pulse frequency is also understood in the context of the present invention as the maximum of the spectral distribution of the preparation pulse.

With regard to the pulse frequency of the preparation pulse, in accordance with the invention, the frequency shift between the preparation pulse and an excitation pulse of the measured sequence is dynamically adjusted during the multislice imaging, as a function of the spatial position of the acquired measured slice, wherein the frequency shift during the measurement can be adjusted both for individual measured slices, in other words measured slice groups containing only a single measured slice, and also for larger blocks, consequently measured slice groups containing a number of measured slices. If, for example, magnetic resonance data for an entire liver are to be acquired, a patient's abdomen, in which the target volume is located, is normally covered by the slice package. For example, 36 measured slices can be used for this. These measured slices in fact cover the whole liver in its entirety, in other words with the target volume, but run from the thoracic region down to the kidneys, from which completely different resonance frequency spectra are produced for the different slices. These are manifested not only in the absolute frequency changes across the measured slices, but also in a change in the chemical shift, i.e. the frequency shift. The use of a dedicated preparation pulse, for example a SPAIR pulse, with a fixed pulse frequency would result either in inhomogeneous saturation of the type of saturation molecule, therefore in inhomogeneous fat saturation, or in unwanted saturation of the type of target molecule, therefore unwanted water saturation. The inventive solution allows the peak frequencies (i.e. the position of the maxima in the resonance frequency spectra) to be followed and consequently allows optimal pulse parameters to be chosen for the fat saturation for individual measured slices or measured slice groups containing a number of measured slices.

A pulse frequency, as a pulse parameter to be adjusted in the context of the present invention, can consequently depend on the peak frequency of the type of target molecule and the frequency shift and/or the peak frequency of the type of saturation molecule. Preferably in addition to the pulse frequency, the pulse bandwidth of the preparation pulse can also be adjusted, specifically and preferably as a function of the chemical shift, i.e. the frequency difference between the maxima of the resonance frequency spectra. More accurate analyses are also possible, so that provision can be made for overlap regions to be derived from the resonance frequency spectra as critical frequency ranges, and for these to be evaluated and taken into consideration, for example in an optimization algorithm, such that an optimal saturation in respect of the type of saturation molecule, in particular fat saturation, and a minimal or justifiable saturation in respect of the type of target molecule, in particular water saturation, is achieved.

Because of the improved saturation achieved in the context of the present invention, a better image quality of a magnetic resonance image dataset derived from the magnetic resonance data is achieved, since overall the fat saturation is more homogeneous and evaluation can be performed with more accurate consideration of the relationships in the measured slices, such that the frequency shift between the preparation pulse and the excitation pulse can be tracked in a way that is specific and appropriate to the actual chemical shift, and ideally a bandwidth adjustment can take place as well, as the chemical shift changes.

It should also be noted that techniques for measuring resonance frequency spectra or for determining resonance frequency spectra by simulation are known in principle in the prior art. Thus the resonance information can expediently be determined as a function of B0 field maps for the type of target molecule and the type of saturation molecule that were determined in the case of a target volume located in the acquisition position, and/or as a function of an anatomical model, at least of the target volume, describing the influence on magnetic fields. B0 field maps are usually in any case measured as Larmor frequency maps, from which the resonance frequency of the acquired type of molecule, to which the excitation pulse is tuned, can be read directly, such that the resonance spectral distribution or the resonance frequency spectra can also be determined in relation to whole target volumes. Also derivations based on calculations, using human models (anatomical models, for example), are additionally or alternatively conceivable.

In the case of a reference to the measured slice or measured slice group to be acquired next, particularly in the event of extreme changes in the resonance frequencies, a presaturation of the type of target molecule of a measured slice or measured slice group adjacent in the acquisition sequence may occur that, as a function of the protocol settings, cannot be dissipated again completely by relaxation mechanisms in the worst cases before the corresponding measured slice is scanned. Were such effects also to be eliminated, the result would be a further improved overall image quality. To this end, the present invention offers two solutions, which can incidentally also be employed independently of the use of the extended resonance information. In other words, the solution can be independent of an adjustment as a function of resonance information describing the resonance frequencies of the type of saturation molecule, and independent of the type of target molecule, for which the magnetic resonance data are to be acquired, in the contiguous partial volumes of the target volume that covers the measured slice group.

In an embodiment of the present invention, the sequence of the acquisition of the measured slice groups is chosen such that, when target molecules of a further measured slice group are excited, this excitation has decayed again pending the acquisition of the further measured slice group and/or the further measured slice group has already been acquired. In this embodiment, the selection is adjusted to the relationships in the target volume, of the acquisition sequence of the measured slices or measured slice groups, so as to avoid such interference saturations as much as possible, either because they cannot occur until the corresponding measured slice group has already been acquired, or by ensuring that the incorrect saturation of the type of target molecule is already dissipated in the further measured slice group when this is finally scanned.

Specifically the sequence of the acquisition of the measured slice groups is chosen such that the resonance frequency of the type of saturation molecule associated with the measured slice groups is increased at the start, with a minimum value from a minimum value if the resonance frequency of the type of saturation molecule is lower than that of the target molecule, or is reduced at the start with a maximum value from a maximum value if the resonance frequency of the type of saturation molecule is higher than that of the type of target molecule. The increase or decrease takes place monotonically across the measured slice groups in the acquisition sequence. In the example of fat saturation, the resonance frequency of fat is normally less than the resonance frequency of water, so that in this example it is proposed that the measured slice groups be acquired in an acquisition sequence such that the fat resonance frequency increases monotonically from a minimum value to a maximum value. This has the advantage that water saturation cannot occur in measured slices that are acquired subsequently in accordance with the acquisition sequence.

In an alternative embodiment, the described increase from a minimum value or reduction from a maximum value may be merely a general tendency, so absolute monotonicity is not required. Such a situation, which permits minor deviations from monotonicity, exists for example in the case of further general conditions for choosing the sequence of acquisition of the measured slice groups. Thus, provision can be made for the sequence of acquisition to be further chosen under the general condition that the consecutive acquisition of two spatially adjacent measured slice groups is avoided, wherein a change in the resonance frequency counter to the general tendency of an increase or reduction in the resonance frequency is minimized in absolute terms because of the general conditions. This means that measured slice groups to be acquired consecutively in time do not necessarily have to be adjacent, but the frequency change counter to the general tendency is then kept as minimal as possible, and consequently also ideally has a minimum effect.

In another embodiment for reducing potential unwanted saturations of the type of target molecule in further measured slice groups, when determining the pulse parameters for a measured slice group, the resonance information of at least one other measured slice group adjacent to the measured slice group in the acquisition sequence is taken into consideration. In this embodiment, the pulse parameters that are to be adjusted, in particular the pulse frequency, are chosen not only as a function of the target volume to be acquired next, but also as a function of other following measured slices in the acquisition sequence. For example, if an acquisition scheme is used for five measured slices that can be designated as FS M1, FS M2, FS M3, FS M4, and FS M5, where FS designates the fat saturation pulse and Mi the scanning of the i-th measured slice, the resonance information from M2 to n (where n can be up to 5) can additionally be taken into consideration when determining the optimum pulses parameters for FS prior to M1. The resonance information of the further measured slice groups can be added with a lesser weight to the resonance information of the measured slice group currently under consideration, and for which pulse parameters are to be determined. This can alternatively or additionally be done when using an optimization procedure to determine the pulse parameters to be taken into consideration as a weighted penalty term. In this case the second, target-directed procedure is preferred, since pulse parameters that can result in an unwanted saturation excitation in further measured slice groups to be subsequently acquired can be made selectively unattractive by a penalty term in the optimization procedure. This embodiment nevertheless still has advantages, since a less satisfactory saturation of the type of saturation molecule in a preceding measured slice group should be evaluated as not as bad as a loss of signal of the type of target molecule as a result of unwanted saturation in a subsequent slice.

As mentioned, the inventive procedure can be applied advantageously to the acquisition of water images in the case of fat saturation or fat images in the case of water saturation, so that expediently the type of saturation molecule and the type of target molecule are chosen from the group containing fat and water.

In addition to the method, the present invention concerns a magnetic resonance apparatus having a controller configured to operate an MR data acquisition scanner in order to implement the inventive method. All explanations relating to the inventive method apply to the inventive magnetic resonance apparatus, with which the noted advantages can consequently also be obtained. The controller can have a pulse parameter determination processor for determining the pulse parameters as a function of the resonance information, and an acquisition sequence selection processor, for the corresponding embodiments of the method to be implemented.

The invention further encompasses a non-transitory, computer-readable data storage medium that can be loaded into a memory that is accessible by a controller of a magnetic resonance apparatus. The storage medium is encoded with program code that causes the steps of the method described herein to be implemented when the program code is executed in the controller. The electronically readable data carrier can be, for example, a CD ROM.

BRIEF DESCRIPTION OF THE DRAWINGS

FIG. 1 is a flowchart of an exemplary embodiment of the inventive method.

FIG. 2 shows theoretical, ideal resonance frequency spectra for fat and water.

FIG. 3 shows real resonance frequency spectra for fat and water in a measured slice group affected by field inhomogeneities.

FIG. 4 shows a characteristic of peak frequencies across different measured slices to be acquired.

FIG. 5 shows peak frequency characteristics in the case of a changed acquisition sequence.

DESCRIPTION OF THE PREFERRED EMBODIMENTS

Figure 6:
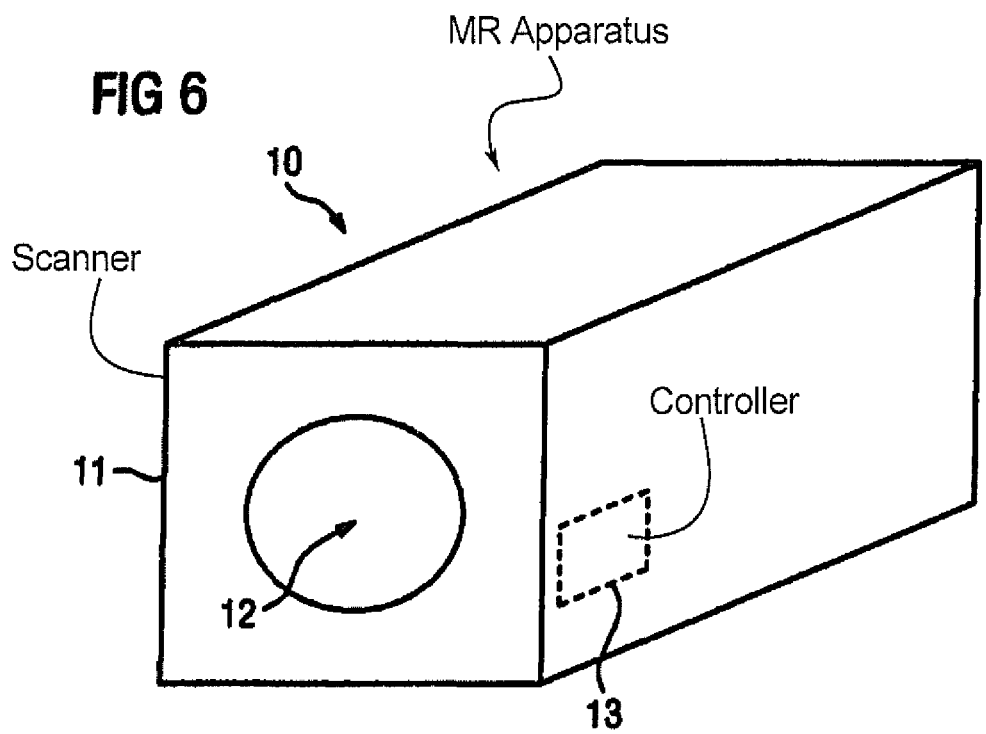
FIG. 6 is a block diagram of an inventive magnetic resonance apparatus.
Figure 7:
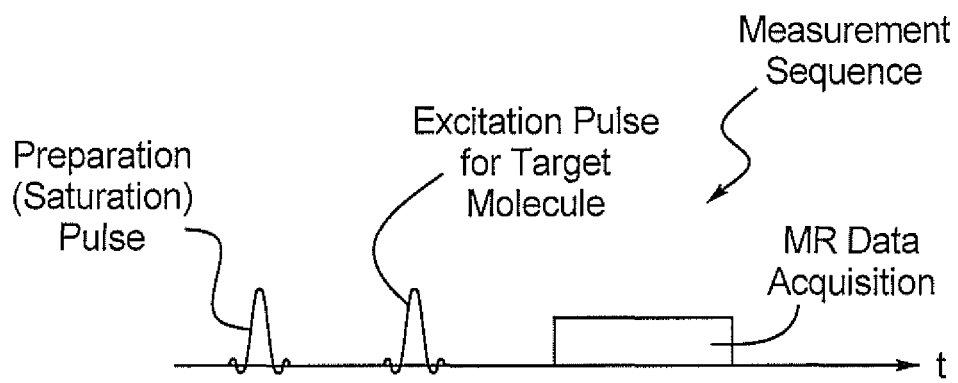
FIG. 7 schematically illustrates the basic components of a pulse sequence with a preparation (saturation) pulse preceding excitation of the target nuclear spins.

FIG. 1 is a flowchart of an exemplary embodiment of the present invention, as can be employed in the context of acquiring magnetic resonance data with fat saturation, if the patient's target volume to be acquired is divided into a plurality of slice packages containing measured slices and the measured slices are not acquired simultaneously, in particular individually one after the other. In general a preparation pulse (saturation pulse) is emitted prior to the acquisition of each measured slice, so as to selectively chemically excite the fat molecules as a type of saturation molecule and bring them to saturation such that, during the following excitation pulses, the measuring sequence for the measured slice ideally excites only the water molecules as a type of target molecule and delivers a signal. The preparation pulse and the excitation pulse consequently have a frequency shift that is dictated by the chemical shift between water and fat.

In a step S1 of the method according to FIG. 1, acquisition parameters are provided, which may have been entered by a user directly at a user interface of the magnetic resonance apparatus and/or are given by selecting a measuring protocol. The acquisition parameters describe the subsequent acquisition procedure initially in an abstract manner that is comprehensible for the user, by for example describing the target volume, the division thereof into measured slices, the measuring sequence to be used, the fat saturation technique to be used, etc., by virtue of the acquisition parameters. The acquisition parameters in step S1 are, for preparation of the actual acquisition procedure, converted into specific control parameters for the components of the magnetic resonance device, in particular a gradient coil arrangement, a radio frequency coil arrangement, of local coils, shim coils, etc. The inventive method relates to part of this procedure.

The exemplary embodiment described herein initially uses resonance information 1 in step S2 to determine specific pulse parameters of the preparation pulse, in this case at least the pulse frequency and the pulse bandwidth, wherein other pulse parameters can of course also be adjusted, for example the pulse amplitude, the actuation of individual antennas of the radio frequency coil arrangement via which the preparation pulse is emitted, etc. Pulse parameters adjusted in this case are determined for each individual measured slice or the preparation pulse associated therewith, i.e. the resonance information 1 is present in a manner specific to each measured slice and describes the resonance behavior both of the fats as a type of saturation molecule and also of the water molecules as a type of target molecule. In this case this is given in the form of resonance frequency spectra for the respective measured slice, consequently of resonance frequency distributions that indicate both for the water molecules and for the fat molecules how much signal response to a radio frequency pulse is likely at which frequencies. It has been shown that the relative position of the peak frequencies of fat and water, and consequently the chemical shift, can also change from measured slice to measured slice. In this case the peak frequency is the resonance frequency at which the maximum signal response of the respective type of molecule is expected in the resonance frequency spectrum. A peak width as well can be defined in the known manner, such that it is conceivable in exemplary embodiments to indicate merely the peak width and the peak frequencies as resonance information 1. However, the entire characteristic of the resonance frequency spectrum is preferably taken into consideration, as will be explained in greater detail in respect of FIG. 2 and FIG. 3.

FIG. 2 shows a resonance frequency spectrum 2 for water and a resonance frequency spectrum 3 for fat in an ideally homogeneous constant magnetic field in a measured slice. The resonance frequency spectra 2, 3 are here indicated via the chemical shift compared to the nominal Larmor frequency of the magnetic resonance device, wherein the positive shift extends leftward, i.e. the fat peak frequency 4 is less than the water peak frequency 5.

It is apparent that both resonance frequency spectra 2, 3 are clearly spaced apart and separated, such that a saturation range 6 that is to be affected by the preparation pulse can readily be defined.

FIG. 3 shows the effects of magnetic inhomogeneities on the resonance frequency spectra 2, which become wider and where appropriate may also change their position relative to one another. It is apparent that only one critical frequency range 7 occurs, in which the resonance frequency spectra 2, 3 overlap, and consequently both water molecules and fat molecules can be excited by a corresponding radio frequency pulse.

An optimization procedure performed in step S2 to determine optimum pulse parameters, and which in the corresponding measured slice is aimed at the saturation of the magnetization of as many fat molecules as possible with as little loss as possible of water signals as a result of unwanted water saturation, also consequently takes into consideration this critical frequency range 7 given by the overlap region of the resonance frequency spectra 2, 3. In this way the specific relationships within the individual measured slices can be taken into consideration and the saturation range 6 can be optimally determined on the basis of specific measured slices in a particularly effective manner.

A further circumstance, which arises from the fact that the preparation pulse acts on the entire target volume, will be explained for further measures to improve the quality of the magnetic resonance data to be acquired.

To this end, FIG. 4 shows the characteristics 8, 9 of peak frequencies 4, 5 across measured slices M1 to M16 to be acquired, wherein the characteristic 8 relates to the fat molecules, and the characteristic 9 relates to the water molecules. Not only can it be seen from these characteristics 8, 9, as has already been indicated, that the chemical shift can also change for spatially adjacent measured slices when the peak frequencies 4, 5 are considered, but it also becomes clear that in regions of major change there is a risk that, as a result of a preparation pulse of a measured slice, for example the measured slice M1, water molecules can inadvertently be excited and saturated in a further subsequent measured slice, for example the measured slice M2, in the acquisition sequence, such that their signal may be lost. It is possible, in another exemplary embodiment, to seek to prevent this, by taking into consideration penalty terms from the resonance information for further subsequent measured slices in the acquisition sequence in the context of the optimization procedure in step S2. However, this is less preferred, since then damage may occur in respect of the fat saturation in the measured slice to be currently acquired.

Consequently an alternative and preferred variant, also used in the exemplary embodiment illustrated in FIG. 1, provides for the acquisition sequence of the measured slices M1, . . . , M16 to be adjusted adroitly, in order to prevent this, wherein once again the resonance information 1 is taken into consideration.

According to FIG. 1 this also occurs in step S3, wherein the acquisition sequence of the individual measured slices M1 to M16 is chosen such that in the acquisition sequence the fat saturation frequency, in other words the fat peak frequency 4, develops such that it increases monotonically from a minimum value to a maximum value. This is illustrated in greater detail in FIG. 5 following on from the example in FIG. 4.

In order to achieve the monotonically increasing behavior, the acquisition sequence M6, M5, M3, M2, M1, M4, M7, M8 . . . M16 is consequently chosen, with slices M6, M5, and M3 forming a slice group SG in which the peak frequency change intensities 8' and 9' are approximately the same from slice to slice, slices MZ, M1, M4 and M7 each being (by themselves) another slice group, and slices M8-M16 being another slice group SG wherein 8' and 9' are approximately the same from slice to slice. The corresponding, resulting peak frequency characteristics 8', 9' across the cited acquisition sequence are shown in FIG. 5 and for both peak frequencies 4, 5 exhibit monotonically increasing behavior. This effectively prevents unwanted water saturation occurring in measurement slices that are not acquired until later in the acquisition sequence.

In step S4 (see FIG. 1 once again) the magnetic resonance data is then acquired using the measured-slice-specific pulse parameters determined in step S2 and the acquisition sequence of measured slices M1-M16 determined in step S3. Although the present case has been described with respect to individual measured slices, for which in each case the acquisition position and the preparation pulse are adjusted, it is of course also possible for multiple measured slices to be combined in one measured slice, which is appropriate, for example, if breath-holding techniques are being used. Then, for example, the measured slices that are acquired during a single breath-holding procedure can always be combined to form a measured slice group.

FIG. 6 shows a schematic diagram of an inventive magnetic resonance apparatus 10 which, as is known in principle, has a scanner 11 that contains the basic field magnet for generating the constant magnetic field. Surrounding the cylindrical patient aperture 12, into which a patient can be introduced by a patient couch (not shown), are a radio frequency coil arrangement and a gradient coil arrangement (not shown). The preparation pulses and the excitation pulses are emitted via the radio frequency coil arrangement. The local coils designed to transmit can also of course be used for this purpose, as is known in principle. The operation of the magnetic resonance apparatus 10 is controlled by a controller 13, which is also designed to perform the inventive method. To this end, the controller 13 can have not only a sequence control processor, known in principle, for controlling the components for acquiring magnetic resonance data, but also a pulse parameter adjustment processor and an acquisition sequence adjustment processor.

The methods described herein can be the controller executed by the controller 13, when an electronically readable data carrier (not shown) with electronically readable control information (code) stored thereon is loaded into the controller 13 of the magnetic resonance apparatus 10. The program code cause the controller 13 to carry out the method as described.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance data from a slice stack, said method comprising:

operating a magnetic resonance data acquisition scanner to acquire magnetic resonance data from a slice stack, comprising a plurality of measurement slices that collectively form a target volume by executing a measurement sequence comprising a plurality of scans, with each acquisition of magnetic resonance data from each individual measurement slice of the plurality of measurement slices constituting a respective scan in said plurality of scans;

operating the magnetic resonance data acquisition scanner to radiate, prior to each scan of each individual measurement slice, a preparation pulse in said measurement sequence that is associated with the respective individual measurement slices of the plurality of measurement slices from which magnetic resonance data are acquired in the respective scan, but said preparation pulse acting on all of said measurement slices of the plurality of measurement slices in said target volume, said preparation pulse suppressing a magnetic resonance signal, which originates from a type of saturation molecule, in the magnetic resonance data acquired from the respective measurement slice of the plurality of measurement slices in the respective scan;

dividing said slice stack into a plurality of measurement slice groups that each comprise at least one of said measurement slices of the plurality of measurement slices, with each slice group covering a contiguous partial volume of said target volume that is smaller than an entirety of said target volume;

selecting a time order in which to scan said plurality of measurement slice groups so that, when target molecules of each measurement slice group of the plurality of measurement slice groups are excited outside of the scan of each measurement slice group of the plurality of measurement slice groups, the excitation of said target molecules of each measurement slice group has decayed before a start of a scan of said further another measurement slice group in said plurality of measurement slice groups, or said magnetic resonance data from each measurement slice group have already been acquired;

operating said magnetic resonance data acquisition scanner to select at least one of a pulse frequency and a pulse bandwidth as at least one pulse parameter of said preparation pulse for a respective measurement slice group in said plurality of measurement slice groups, dependent on resonance information of the contiguous partial volume covered by said respective measurement slice group, said resonance information describing at least respective, different resonance frequencies of said type of said saturation molecule and a type of target molecule from which said magnetic resonance data are to be acquired in said contiguous partial volume of said target volume covered by said respective measurement slice group; and providing said magnetic resonance data to a processor and making the magnetic resonance data available from the processor in electronic form, as a data file.

2. A method as claimed in claim 1 comprising selecting said pulse bandwidth as said at least one pulse parameter, and selecting said pulse bandwidth dependent on a chemical shift in said partial volume described by said resonance information.

3. A method as claimed in claim 1 comprising selecting said resonance information from the group consisting of a resonance frequency spectrum of said type of said saturation molecule, a resonance frequency spectrum of said type of target molecule, a peak frequency of the resonance frequency spectrum of the type of saturation molecule, a peak frequency of the resonance frequency spectrum of said type of target molecule, a peak width of said resonance frequency spectrum of said type of saturation molecule, and a peak width of said resonance frequency spectrum of said type of target molecule.

4. A method as claimed in claim 1 comprising, in a processor, determining said resonance frequency information from B0 field maps for said type of target molecule and said type of saturation molecule determined for respective target volumes in an acquisition position.

5. A method as claimed in claim 1 comprising, in a processor, determining said resonance frequency information dependent on an anatomical model, of at least said target volume, that describes an influence on magnetic fields.

6. A method as claimed in claim 1 comprising in said time order, increasing the resonance frequencies of the type of saturation molecule associated with the measurement slice group at a start of said time order with a minimum value, from said minimum value, if said resonance frequency of said type of saturation molecule is lower than the resonance frequency of the target molecule, and reducing said resonance frequency at the start of said time order with a maximum value, from said maximum value, if the resonance frequency of the type of saturation molecule is higher than the resonance frequency of the type of target molecule, with each of said increase and said decrease being monotonic across the measurement slice group in said sequence.

7. A method as claimed in claim 1 comprising, selecting said at least one pulse parameters for said respective measurement slice group of the plurality of measurement slice groups, using resonance information of another measurement slice group in said plurality of measurement slice groups, that is adjacent to the respective measurement slice group.

8. A method as claimed in claim 7 comprising adding said resonance information from said another measurement slice group of the plurality of measurement slice groups with a lower weight to the resonance information of said respective measurement slice group.

9. A method as claimed in claim 7 comprising using said resonance information from said respective measurement slice group in an optimization algorithm, with a weighted penalty term, to determine said pulse parameters.

10. A method as claimed in claim 1 wherein said type of saturation molecule and said type of target molecule are selected from the group consisting of fat molecules and water molecules.

11. A magnetic resonance apparatus comprising:
a magnetic resonance data acquisition scanner; and
a control computer configured to:

operate said a magnetic resonance data acquisition scanner to acquire magnetic resonance data from a slice stack, comprising a plurality of measurement slices that collectively form a target volume, by executing a measurement sequence comprising a plurality of scans, with each acquisition of magnetic resonance data from each individual measurement slice of the plurality of measurement slices constituting a respective scan in said plurality of scans;

operate said magnetic resonance data acquisition scanner to radiate, prior to each scan of each individual measurement slice of the plurality of measurement slices, a preparation pulse in said measurement sequence that is associated with the respective individual measurement slice of the plurality of measurement slices from which magnetic resonance data are acquired in the respective scan, but said preparation pulse acting on all of said measurement slices of the plurality of measurement slices in said target volume, said preparation pulse suppressing a magnetic resonance signal, which originates from a type of saturation molecule, in the magnetic resonance data acquired from the respective measurement slice of the plurality of measurement slices in the respective scan;

divide said slice stack into a plurality of measurement slice groups that each comprise at least one of said measurement slices of the plurality of measurement slices, with each measurement slice group of the plurality of measurement slice groups covering a contiguous partial volume of said target volume that is smaller than an entirety of said target volume;

select a time order in which to scan said plurality of measurement slice groups so that, when target molecules of each measurement slice group of the plurality of measurement slice groups are excited outside of the scan of each measurement slice group of the plurality of measurement slice groups, the excitation of said target molecules of each measurement slice group has decayed before a start of a scan of said further another measurement slice group in said plurality of measurement slice groups, or said magnetic resonance data from each measurement slice group have already been acquired;

operate said magnetic resonance data acquisition scanner to select at least one of a pulse frequency and a pulse bandwidth as at least one pulse parameter of said preparation pulse for a measurement slice group in said plurality of measurement slice groups, dependent on resonance information of the contiguous partial volume covered by said respective measurement slice group, said resonance information describing at least respective, different resonance frequencies of said type of said saturation molecule and a type of target molecule from which said magnetic resonance data are to be acquired in said contiguous partial volume of said target volume covered by said respective measurement slice group; and provide said magnetic resonance data to a processor and make the magnetic resonance data available from the processor in electronic form, as a data file.

12. A non-transitory, computer-readable data storage medium encoded with programming instructions, said storage medium being loaded into a control computer of a magnetic resonance apparatus, that comprises a magnetic resonance data acquisition scanner, said programming instructions causing said control computer to:

operate the magnetic resonance data acquisition scanner to acquire magnetic resonance data from a slice stack, comprising a plurality of measurement slices that collectively form a target volume by executing a measurement sequence comprising a plurality of scans, with each acquisition of magnetic resonance data from each individual measurement slice of the plurality of measurement slices constituting a respective scan in said plurality of scans;

operate the magnetic resonance data acquisition scanner to radiate, prior to each scan of each individual measurement slice of the plurality of measurement slices from which magnetic resonance data are acquired in the respective scan, but said preparation pulse acting on all of said measurement slices of the plurality of measurement slices in said target volume, a preparation pulse in said measurement sequence that is associated with the respective individual measurement slice of the plurality of measurement slices, said preparation pulse suppressing a magnetic resonance signal, which originates from a type of saturation molecule in the magnetic resonance data acquired from the respective measurement slice of the plurality of measurement slices in the respective scan;

divide said slice stack into a plurality of measurement slice groups that each comprise at least one of said measurement slices of the plurality of measurement slices, with each slice group of the plurality of measurement slice groups covering a contiguous partial volume of said target volume that is smaller than an entirety of said target volume;

select a time order in which to scan said plurality of measurement slice groups so that, when target molecules of each measurement slice group of the plurality of measurement slice groups are excited outside of the scan of each measurement slice group of the plurality of measurement slice groups, the excitation of said target molecules of each measurement slice group has decayed before a start of a scan of said further another measurement slice group in said plurality of measurement slice groups, or said magnetic resonance data from each measurement slice group have already been acquired;

operate said magnetic resonance data acquisition scanner to select at least one of a pulse frequency and a pulse bandwidth as at least one pulse parameter of said preparation pulse for a respective measurement slice group in said plurality of measurement slice groups, dependent on resonance information of the contiguous partial volume covered by said measurement slice group, said resonance information describing at least respective, different resonance frequencies of said type of said saturation molecule and a type of target molecule from which said magnetic resonance data are to be acquired in said contiguous partial volume of said target volume covered by said respective measurement slice group of the plurality of measurement slice groups; and provide said magnetic resonance data to a processor and making the magnetic resonance data available from the processor in electronic form, as a data file.

13. A method for acquiring magnetic resonance data from a slice stack, said method comprising:

operating a magnetic resonance data acquisition scanner to acquire magnetic resonance data from a slice stack, comprising a plurality of measurement slices that collectively form a target volume by executing a measurement sequence comprising a plurality of scans, with each acquisition of magnetic resonance data from each individual measurement slice of the plurality of measurement slices constituting a respective scan in said plurality of scans;

operating the magnetic resonance data acquisition scanner to radiate, prior to each scan of each individual measurement slice, a preparation pulse in said measurement sequence that is associated with the respective individual measurement slices of the plurality of measurement slices from which magnetic resonance data are acquired in the respective scan, but said preparation pulse acting on all of said measurement slices of the plurality of measurement slices in said target volume, said preparation pulse suppressing a magnetic resonance signal, which originates from a type of saturation molecule, in the magnetic resonance data acquired from the respective measurement slice of the plurality of measurement slices in the respective scan;

dividing said slice stack into a plurality of measurement slice groups that each comprise at least one of said measurement slices of the plurality of measurement slices, with each slice group covering a contiguous partial volume of said target volume that is smaller than an entirety of said target volume;

operating said magnetic resonance data acquisition scanner to select at least one of a pulse frequency and a pulse bandwidth as at least one pulse parameter of said preparation pulse for a respective measurement slice group in said plurality of measurement slice groups, dependent on resonance information of the contiguous partial volume covered by said respective measurement slice group, said resonance information describing at least respective, different resonance frequencies of said type of said saturation molecule and a type of target molecule from which said magnetic resonance data are to be acquired in said contiguous partial volume of said target volume covered by said respective measurement slice group, wherein said at least one pulse parameter is selected for said respective measurement slice group of the plurality of measurement slice groups based on resonance information of another measurement slice group of said plurality of measurement slice groups, said other measurement slice group being adjacent to the respective measurement slice group; and providing said magnetic resonance data to a processor and making the magnetic resonance data available from the processor in electronic form, as a data file.

14. A method as claimed in claim 13 comprising adding said resonance information from said another measurement slice group of the plurality of measurement slice groups with a lower weight to the resonance information of said respective measurement slice group.

15. A method as claimed in claim 13 comprising using said resonance information from said respective measurement slice group in an optimization algorithm, with a weighted penalty term, to determine said pulse parameters.

16. A magnetic resonance apparatus comprising:
the magnetic resonance data acquisition scanner; and
a control computer configured to perform the method of claim 13.

17. A non-transitory, computer-readable data storage medium encoded with programming instructions, said storage medium being loaded into a control computer of a magnetic resonance apparatus, that comprises the magnetic resonance data acquisition scanner, said programming instructions causing said control computer to perform the method of claim 13.

\* \* \* \* \*